United States Patent
Nagamine

(10) Patent No.: US 9,293,839 B2
(45) Date of Patent: Mar. 22, 2016

(54) CARD MEMBER, CARD EDGE CONNECTOR, AND METHOD FOR MANUFACTURING CARD MEMBER

(71) Applicant: J.S.T. Mfg. Co., Ltd., Osaka-shi, Osaka (JP)

(72) Inventor: Akira Nagamine, Miyoshi (JP)

(73) Assignee: J.S.T. MFG. CO., LTD., Osaka-shi (JP)

( * ) Notice: Subject to any disclaimer, the term of this patent is extended or adjusted under 35 U.S.C. 154(b) by 218 days.

(21) Appl. No.: 13/864,683

(22) Filed: Apr. 17, 2013

(65) Prior Publication Data

US 2013/0288541 A1 Oct. 31, 2013

(30) Foreign Application Priority Data

Apr. 27, 2012 (JP) ................... 2012-103112

(51) Int. Cl.

| | |
|---|---|
| H01R 13/52 | (2006.01) |
| H01R 4/18 | (2006.01) |
| H01R 43/24 | (2006.01) |
| H05K 3/28 | (2006.01) |
| H01R 12/72 | (2011.01) |
| H05K 1/11 | (2006.01) |
| H05K 3/00 | (2006.01) |

(52) U.S. Cl.
CPC ............... *H01R 4/184* (2013.01); *H01R 4/188* (2013.01); *H01R 13/52* (2013.01); *H01R 43/24* (2013.01); *H05K 3/284* (2013.01); *H01R 12/721* (2013.01); *H01R 13/5219* (2013.01); *H05K 1/117* (2013.01); *H05K 3/0097* (2013.01); *H05K 2203/1316* (2013.01); *H05K 2203/1327* (2013.01)

(58) Field of Classification Search
CPC ...... H05K 5/065; H01R 13/52; H01R 12/727; H01R 43/24; H01R 4/188; H01R 4/184; H01R 13/5219
See application file for complete search history.

(56) References Cited

U.S. PATENT DOCUMENTS

| | | | | |
|---|---|---|---|---|
| 4,303,291 | A * | 12/1981 | Dines ............................. | 29/843 |
| 5,655,917 | A * | 8/1997 | Kaneshige et al. ............ | 439/155 |
| 5,823,799 | A * | 10/1998 | Tor et al. ......................... | 439/79 |
| 7,210,944 | B1* | 5/2007 | Chang et al. ................ | 439/76.1 |
| 7,232,345 | B2* | 6/2007 | Ishizuka et al. .............. | 439/660 |
| 7,249,978 | B1* | 7/2007 | Ni .................................. | 439/660 |
| 7,267,575 | B1* | 9/2007 | Hwang ........................ | 439/497 |
| 7,303,438 | B2* | 12/2007 | Dawiedczyk et al. ... | 439/607.53 |
| 7,661,974 | B1* | 2/2010 | Sun ............................... | 439/328 |

(Continued)

FOREIGN PATENT DOCUMENTS

JP        4478007 B2   3/2010

*Primary Examiner* — Briggitte R Hammond
(74) *Attorney, Agent, or Firm* — Kratz, Quintos & Hanson, LLP

(57) ABSTRACT

A method for manufacturing a card member includes: preparing a substrate having a card edge section with card edge terminals to be connected to an opposing connector; preparing a fist mold and a second mold that have molding spaces for molding a resin molded section having a fitting section to be fitted with the opposing connector formed around the substrate; placing the substrate inside the molding spaces between the first mold and the second mold in such a way that the joining portion of the first mold and the second mold are disposed so as not to be overlapped with the portion where the fitting section is to be formed; injecting a synthetic resin material into the molding space to integrally form the resin molded section around the substrate. The method can provide a card member having an excellent watertightness.

14 Claims, 14 Drawing Sheets

(56) References Cited

U.S. PATENT DOCUMENTS

| | | | |
|---|---|---|---|
| 8,177,564 B1* | 5/2012 | Ito et al. | 439/108 |
| 8,439,706 B2* | 5/2013 | Sytsma et al. | 439/607.46 |
| 8,506,333 B2* | 8/2013 | Wang et al. | 439/626 |
| 8,523,583 B2* | 9/2013 | Ito | 439/108 |
| 8,545,234 B2* | 10/2013 | Szczesny et al. | 439/62 |
| 2006/0189180 A1* | 8/2006 | Lang et al. | 439/76.1 |
| 2007/0099514 A1* | 5/2007 | Ito | 439/660 |
| 2008/0248692 A1* | 10/2008 | Ni et al. | 439/607 |
| 2008/0286990 A1* | 11/2008 | Hiew et al. | 439/55 |
| 2009/0004889 A1* | 1/2009 | Sakamoto et al. | 439/59 |
| 2009/0011617 A1* | 1/2009 | Ebe et al. | 439/55 |
| 2010/0062624 A1* | 3/2010 | Tsai | 439/74 |
| 2010/0273335 A1* | 10/2010 | Wu | 439/80 |
| 2011/0104952 A1* | 5/2011 | Teh | 439/633 |
| 2011/0195595 A1* | 8/2011 | Wu | 439/370 |
| 2012/0184126 A1* | 7/2012 | Chen et al. | 439/345 |

* cited by examiner

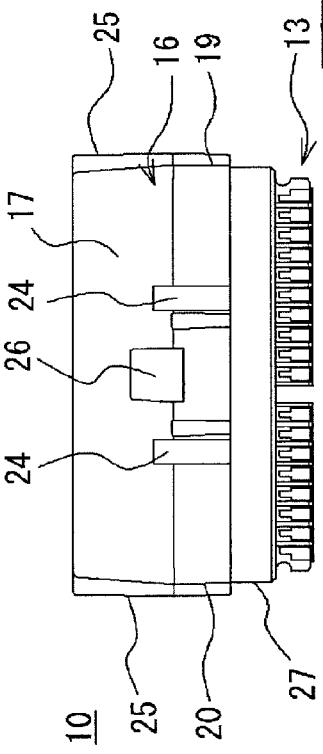
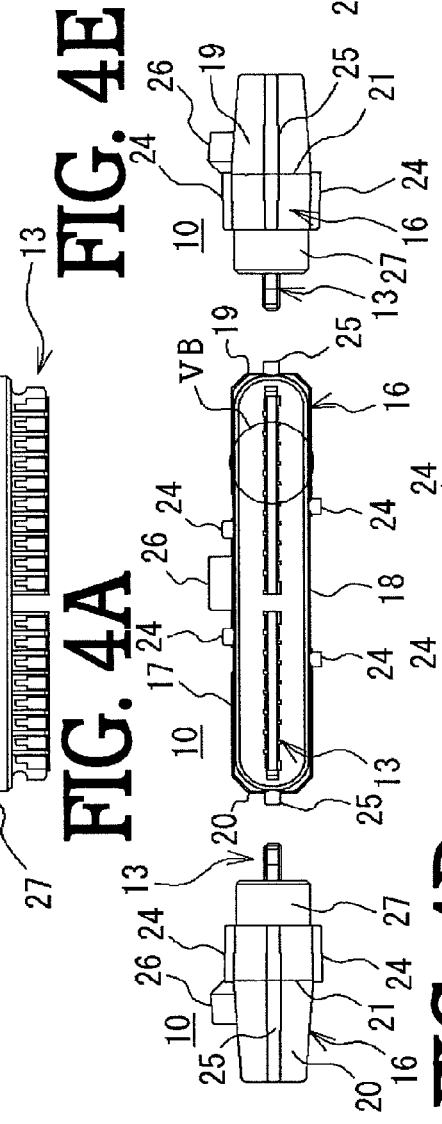
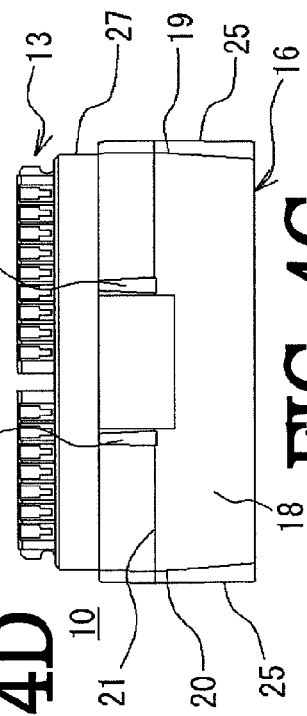

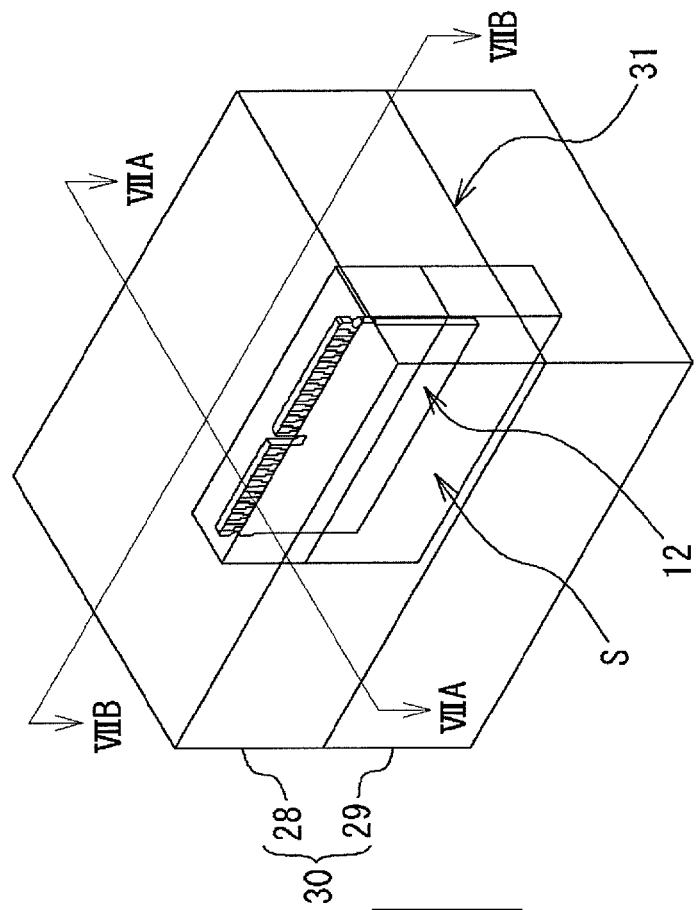
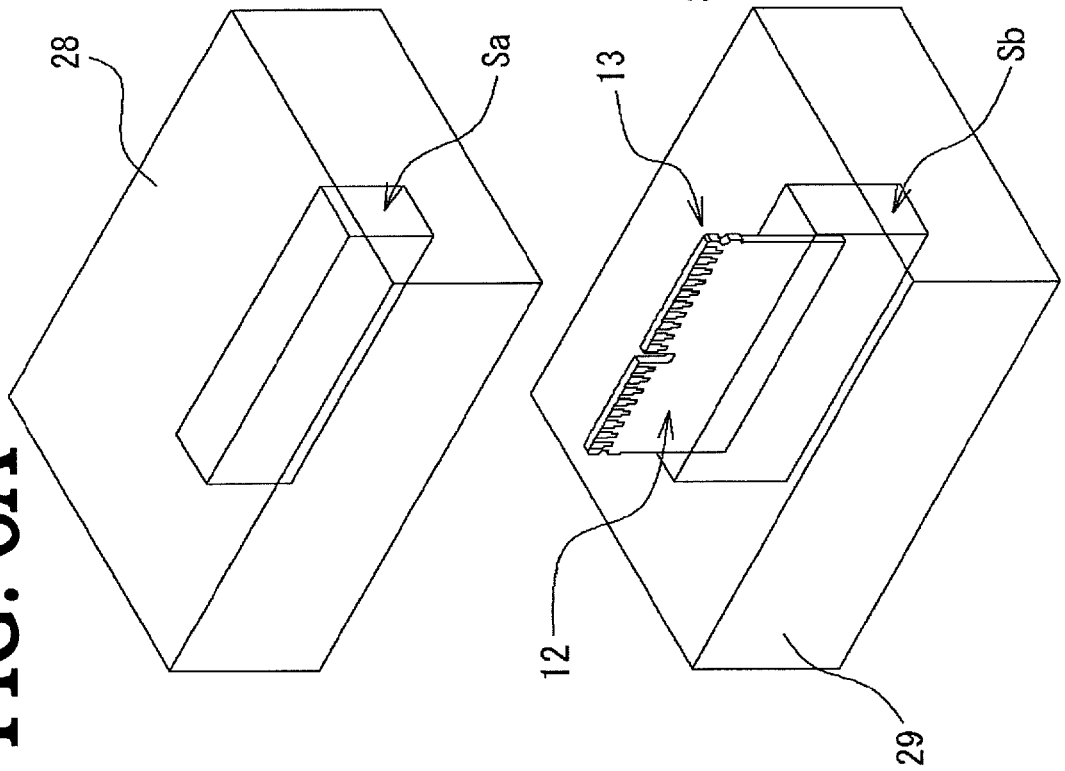

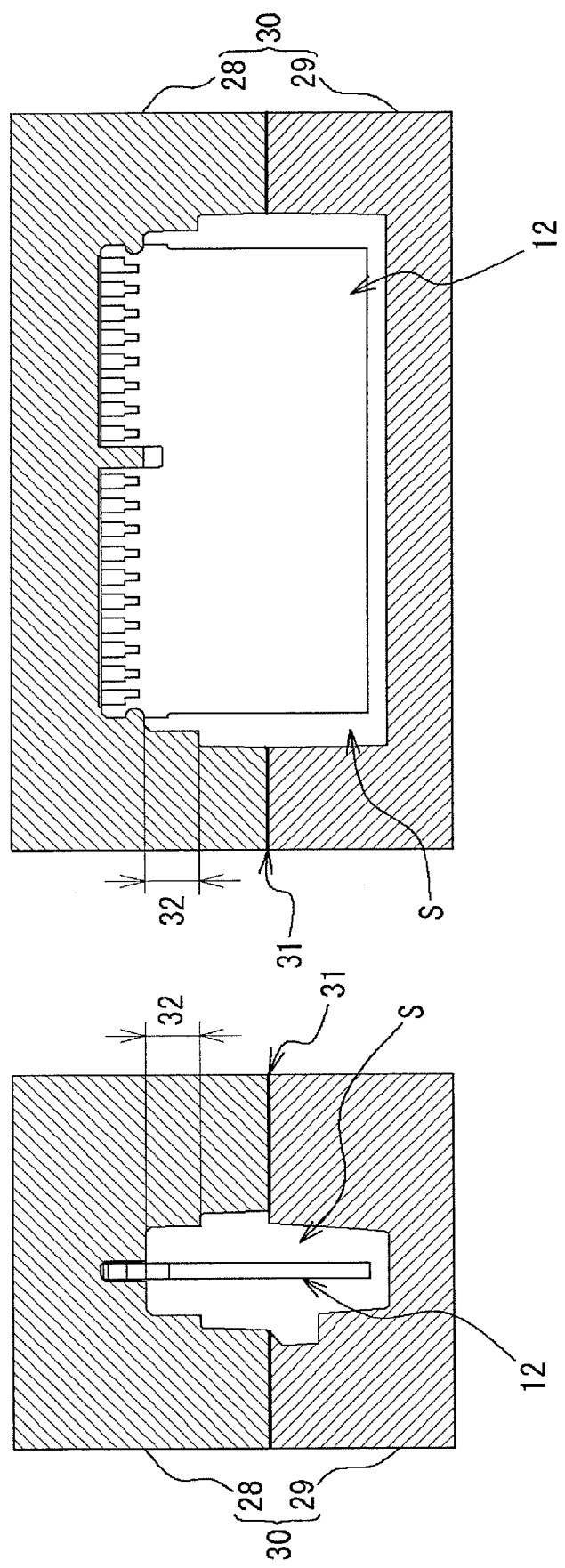

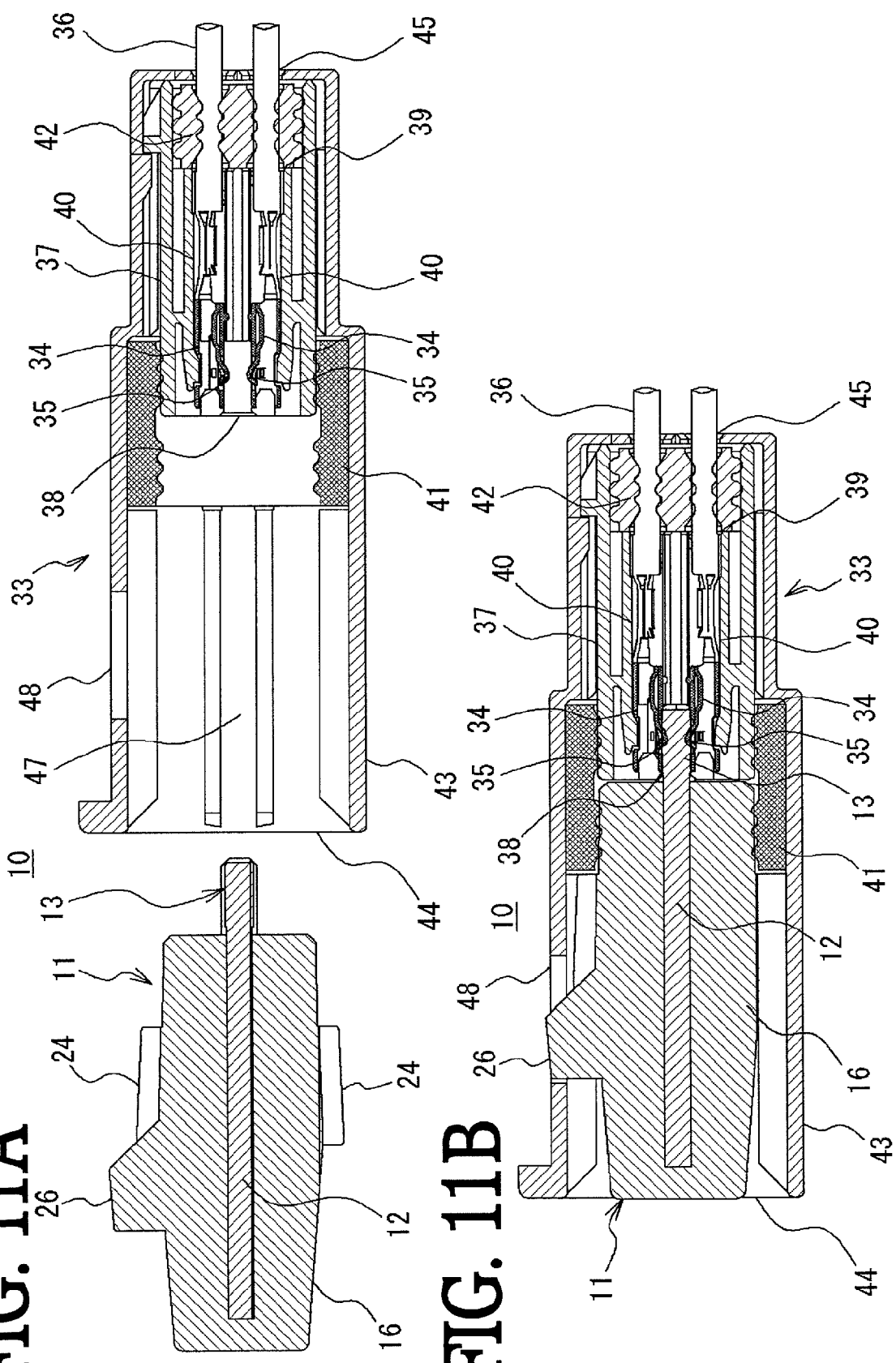

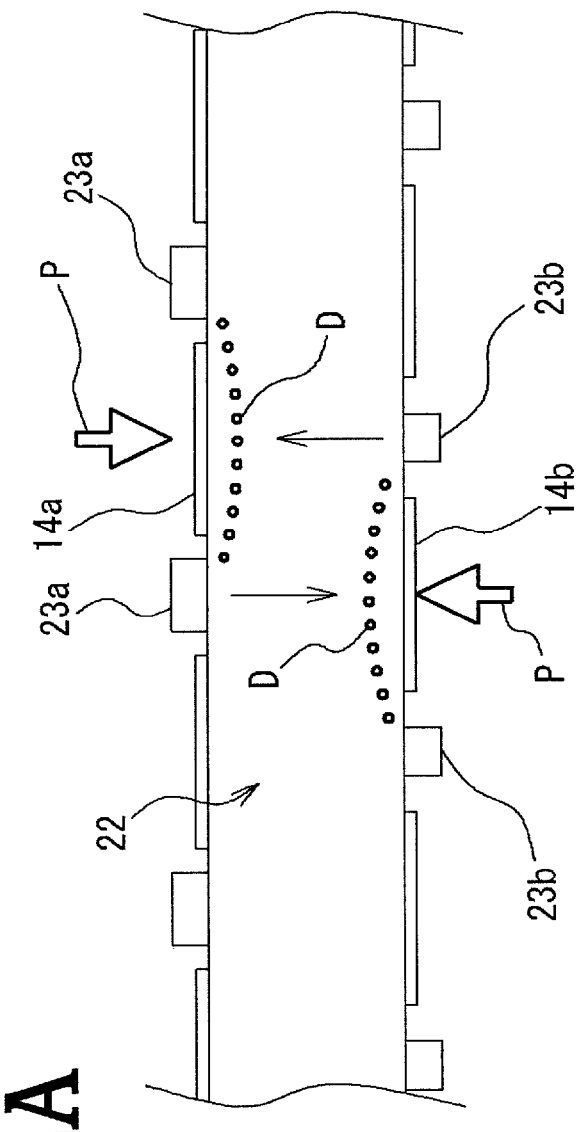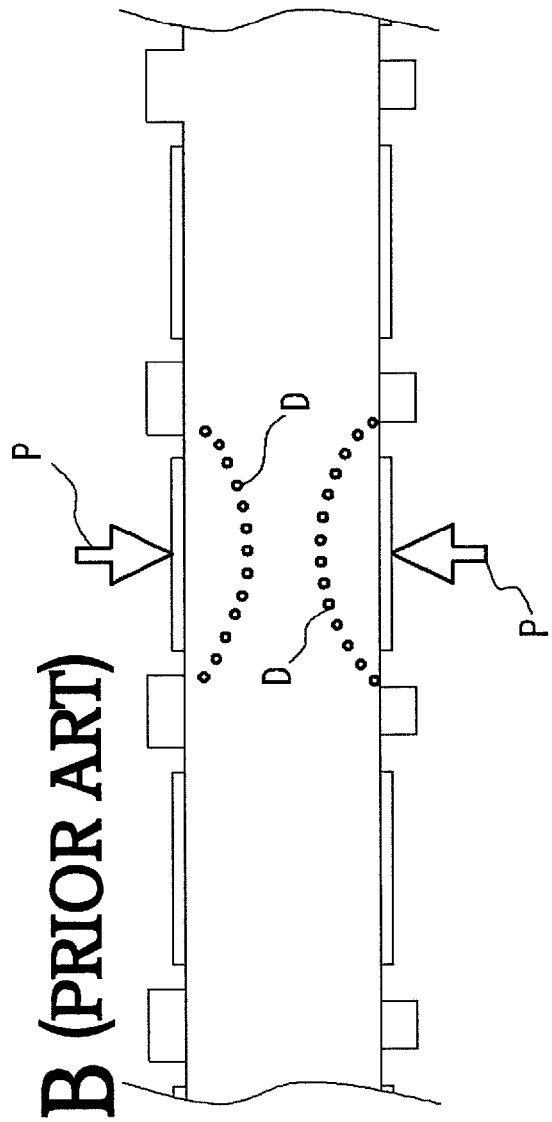
FIG. 12A
FIG. 12B (PRIOR ART)

CARD MEMBER, CARD EDGE CONNECTOR, AND METHOD FOR MANUFACTURING CARD MEMBER

CROSS REFERENCE TO RELATED APPLICATIONS

This application claims priority to Japanese Patent Application No. 2012-103112 filed on Apr. 27, 2013, the entire contents of which are incorporated by reference herein.

TECHNICAL FIELD

The present invention relates to a card member, a card edge connector, and a method for manufacturing a card member, wherein a substrate having card edge terminals connected to an opposing connector is molded integrally from a synthetic resin material. Specifically, the present invention relates to a card member, a card edge connector, and a method for manufacturing a card member wherein a burr (parting line) formed on a joining portion of molds during mold-forming process is not formed on a watertight portion tightly connected to an opposing connector.

BACKGROUND ART

An electronic device for an apparatus used outdoors, a typical example being a vehicle such as an automobile or an automatic two-wheeler, uses a card member, an electronic circuit apparatus, or the like having card edge terminals in which a circuit board is sealed by a resin or the like and integrated in order to be watertight. Japanese Patent Publication No. 4478007 discloses an invention of an electronic circuit device covered by a resin-molded portion. The electronic circuit device disclosed in Japanese Patent Publication No. 4478007 has: a circuit board including electronic components thereon; a resin-molded portion made from a resin disposed so as to cover the electronic components; a convex connector having connecting metal terminals and exposed by the resin-molded portion; and a sealing member wound around the outer periphery of the resin-molded portion. Thus, according to the electronic circuit device disclosed in Japanese Patent Publication No. 4478007, it is possible to provide an electronic circuit device which can be reduced in size and cost and which is reliable.

The resin-molded portion formed on such an electronic circuit device is manufactured by mold-forming using two molds in a common manufacturing process. For example, in the method for manufacturing an electronic circuit device disclosed in Japanese Patent Publication No. 4478007, a circuit board is prepared having a convex connector at the end and electronic components mounted on the surface, two molds are prepared having convex sections around the entire inner peripheries so as to form a cavity composed of a first portion corresponding to the outer shape of the resin-molded portion and a second portion containing the convex connector, the circuit board is placed between the two molds, a resin is injected into the cavity through a resin injection inlet formed between the two molds, and the sealing member, which has two or more elevated parts and one or more depressed part as a cross-sectional shape, is placed in a groove formed in the outer periphery of the resin-molded portion manufactured from the molds.

Devices such as the electronic circuit device disclosed in Japanese Patent Publication No. 4478007 are used while connected to an opposing connector. However, with a device such as an electronic circuit device installed in machinery used primarily outdoors, such as an automobile, an automatic two-wheeler, or another vehicle, or agricultural tools, ships, and airplanes; when the portion connected with the opposing connector is exposed to a liquid such as rainwater, infiltration of the liquid into the electronic circuit device or the like must be suppressed. Therefore, a high degree of watertightness is needed between the card member and the opposing connector connected thereto.

However, when the device is manufactured between two molds, as is the case with the method for manufacturing an electronic circuit device disclosed in Japanese Patent Publication No. 4478007, the injected resin material enters through the joining portion of the two molds, and a small protruding burr (parting line) is formed. When a watertight sealing member is mounted on the portion where this burr is formed, or when the portion with the burr is fitted with the sealing member mounted on the opposing connector, the sealing member is raised up by the burr and a small gap is formed. When a small gap is formed, liquid adhering to the connector could infiltrate the connector through capillarity, and there is a risk of problems occurring with the electronic equipment, causing malfunctions and breakdowns.

The burr could also be removed by polishing after the mold-formation, but manufacturing becomes more time-consuming and costly because a polishing step is needed, and there is a risk of problems with product quality in that the size and shape is different than what was designed when the equipment is grinded down by polishing. If a groove for accommodating the sealing member is formed, as is the case with the electronic circuit device disclosed in Japanese Patent Publication No. 4478007, because the burr is formed, there is a risk of a gap being created between the sealing member and the burr within the groove. Furthermore, because the size and shape of the burr is not constant, there is a risk that a product of insufficient watertightness will be manufactured, and there is also a risk that reliability will be compromised.

In the step for manufacturing the resin molded section, because the mold-forming is performed with the substrate lying horizontally as shown in FIG. 13, problems with this method are that the substrate occupies a large area of the mold in a plan view, only a small number of products can be manufactured by a single resin injection, production efficiency is low, and manufacturing costs are high.

SUMMARY

The present invention was devised in order to solve such problems inherent in the prior art; it being an object of the present invention to provide a card member having a resin molded section formed integrally by mold-forming on a substrate having card edge terminals, wherein a burr (parting line) is not formed on a portion fitted with a sealing member of an opposing connector formed on the card member, and a card edge connector configured from an opposing connector connected with this card member.

Another object of the present invention is to provide a method for manufacturing a card member for resolving the problems described above.

To solve the problems described above, a method for manufacturing a card member of one aspect of the present invention including: preparing a substrate having a card edge section in which at least one card edge terminal to be connected to an opposing connector is formed on at least one surface of the card edge section; preparing a fist mold and a second mold that have molding spaces for molding a resin molded section having a fitting section to be fitted with the opposing connector formed around the substrate, and the card edge section of the substrate protruding from the fitting section; placing the substrate inside the molding spaces between the first mold and the second mold in such a way that the joining portion of the first mold and the second mold are disposed so as not to be overlapped with the portion where the fitting section is to be formed; injecting a synthetic resin material into the molding space to integrally form the resin molded section around the substrate.

In one aspect of the method for manufacturing a card member described above, the joining portion of the first mold and the second mold is disposed perpendicular to the direction in which the card edge section protrudes.

In one aspect of the method for manufacturing a card member described above, one of the first mold and the second mold is disposed on a bottom side while the other is disposed on a top side of the one mold that is disposed on the bottom side; and at least one the substrate is disposed vertically upright inside the first mold and the second mold so that the card edge section is directed upward or downward.

A card member of one aspect of the present invention includes: a substrate having a card edge section in which at least one card edge terminal to be connected to an opposing connector is formed on at least one surface of the card edge section; and a resin molded section having a fitting section to be fitted with the opposing connector formed of synthetic resin material integrally formed with the substrate in which the substrate is protruded from at least one end of the fitting section; wherein the resin molded section is formed with a parting line at the place other than the fitting portion by placing the substrate in a first mold and a second mold during a mold-forming process in such a way that a joining portion of the first mold and the second mold is not overlapped with the fitting portion.

In one aspect of the card member described above, the parting line is disposed in a direction perpendicular to the direction in which the card edge section protrudes.

In one aspect of the card member described above, the fitting section is formed into annular shape around the card edge section.

In one aspect of the card member described above, the end surface of the card edge section is provided with a protecting section formed integrally with the resin molded section.

In one aspect of the card member described above, in the card edge section, dividing wall sections erected between the card edge terminals are formed integrally with the resin molded section.

In one aspect of the card member described above, the dividing wall sections are formed alternatingly on both surfaces of the substrate.

In one aspect of the card member described above, the surfaces of the card edge terminals are formed by tin plating.

A card edge connector of one aspect of the present invention includes: a card member that is connected with the opposing connector; and a card member; wherein the card connector including: a substrate having a card edge section in which at least one card edge terminal to be connected to an opposing connector is formed on at least one surface of the card edge section; and a resin molded section having a fitting section to be fitted with the opposing connector formed of synthetic resin material integrally formed with the substrate in which the substrate is protruded from at least one end of the fitting section; wherein the resin molded section is formed with a parting line at the place other than the fitting portion by placing the substrate in a first mold and a second mold during a mold-forming process in such a way that a joining portion of the first mold and the second mold is not overlapped with the fitting portion.

In one aspect of the card edge connector described above, an annular sealing member is provided to the portion of the opposing connector that is fitted with the fitting section of the card member.

In one aspect of the card edge connector described above, an annular sealing member is mounted to the fitting section of the card member.

In one aspect of the card edge connector described above, the opposing connector has an outer cover body for covering the card member when the card member is connected.

In one aspect of the card edge connector described above, guiding protuberances formed protruding integrally with the resin molded section are provided to a pair of opposing side surfaces of the resin molded section of the card member apart from the fitting section; guiding grooves for guiding the guiding protuberances are formed in the outer cover body; and the guiding protuberances and the guiding grooves are fitted together.

In one aspect of the card edge connector described above, at least one surface of the resin molded section of the card member apart from the fitting section has a locking section formed protruding integrally with the resin molded section; a coupling section which couples with the locking section is formed on the outer cover body of the opposing connector; and the locking section and the coupling section are coupled together.

In one aspect of the card edge connector described above, at least one slit is formed in the card edge section of the card member; and a rib is formed in a position corresponding to the slit in the portion of the opposing connector where the card edge section is connected.

Effect of the Invention

According to the method for manufacturing a card member of the above aspect, because the joining portion of the first mold and the second mold is disposed so as not to be overlapped with the fitting section when the resin molded section of the card member is formed, the burr (parting line) formed in the portion where the first mold and the second mold are joined during mold-forming is not formed in the fitting section of the card member. Therefore, according to the method for manufacturing card member of this aspect, there is no unevenness in the fitting section even when the card member is fitted with the opposing connector, and the watertight property can therefore be increased. According to the method for manufacturing card member of this aspect, because the burr is not formed in the fitting section, there is no need to remove burrs as in conventional practice, and a smooth fitting section can be obtained.

According to the method for manufacturing a card member of the above aspect, because the joining portion of the first mold and the second mold is disposed in a direction perpendicular to the direction in which the card edge section protrudes when the resin molded section of the card member is formed, the burr is formed in a position excluding the fitting section of the card member, and because the burr is formed in a direction perpendicular to the direction in which the card edge section protrudes, formation of the burr on the fitting section can be better avoided.

According to the method for manufacturing a card member of the above aspect, by disposing the substrate oriented vertically inside the first mold and the second mold, the joining portion of the first mold and the second mold can be disposed perpendicular to the flat surface of the substrate so as to not correspond with the fitting section of the resin molded section of the card member even if a vertical molding machine is used, and a card member in which a burr is not formed on the fitting section can be manufactured more efficiently. According to the method for manufacturing a card member of the above aspect, because a cut is made in the molds so that the substrate can be disposed vertically, more card members can be obtained in a single molding than in cases in which the substrate is formed as being disposed horizontally, and card members can be manufactured more efficiently while keeping production costs low.

In the card member of the above aspect of the present invention, because the joining portion of the first mold and the second mold is disposed so as not to be overlapped with the fitting section when the resin molded section of the card member is formed, the burr or parting line formed in the portion where the first mold and the second mold are joined during mold-forming is not formed in the fitting section of the card member. Therefore, according to the card member of this aspect, there is no unevenness in the fitting section even when the card member is fitted with the opposing connector, and the watertight property can therefore be increased. According to the card member of this aspect, because a burr or parting line is not formed in the fitting section, there is no need to remove burrs as in conventional practice, and a smooth fitting section can be obtained.

According to the card member of the above aspect, due to the substrate being disposed in a vertical direction inside the first and second molds, the joining portion of the first mold and second mold, which are disposed vertically overlapping, can be disposed in a position excluding the fitting section and in a direction perpendicular to the flat surface of the substrate, and therefore a card member can be obtained in which a burr or parting line is not formed on the fitting section of the resin molded section even if a conventionally employed vertical molding machine is used. At this time, because the card edge section of the substrate is disposed facing upward or downward, the joining portion of the molds is not positioned in the fitting section. The same effects can be obtained by disposing the card edge section in a vertical direction even in cases in which card edge sections are formed at both ends of the substrate.

According to the card member of the above aspect, because the fitting section formed on the card member fitted with the opposing connector is formed into an annular shape, the card member can be fitted with the opposing connector without any gaps, and watertightness can be further increased because a burr is not formed on the fitting section.

According to the card member of the above aspect, because the card edge section is covered by the protecting section, impact from falling can be softened. By providing the card edge section with the protecting section, scratches to the substrate from contact with the contact of the opposing connector can be suppressed when the card edge terminals and the opposing connector are connected.

According to the card member of the above aspect, when liquid infiltrates the card edge section, because the card edge terminals are subdivided into separate locations, liquid infiltrating one subdivision can be suppressed from spreading to other subdivisions, and short circuiting of the substrate can be suppressed.

According to the card member of the above aspect, due to the dividing wall sections being formed alternately on the front surface and rear surface, dividing wall sections are provided on the sides opposite the card edge terminals which touch the contact; therefore, one source of pressure force can be supported by the dividing wall sections, and deformation of the substrate can be suppressed.

According to the card member of the above aspect, due to the surface of the card edge terminals being formed from tin plating, manufacturing costs can be kept lower than with gold plating which has been used conventionally in card edge terminals. Whiskers, which have been a problem with tin plating, are suppressed from coming in contact with other card edge terminals due to the dividing wall sections being formed between the card edge terminals, and short circuiting of the substrate can be suppressed.

According to the card edge connector of the above aspect of the present invention, because the joining portion of the first mold and the second mold is disposed so as not to be overlapped with the fitting section when the resin molded section of the card member is formed, the burr or parting line formed in the portion where the first mold and the second mold are joined during mold-forming is not formed in the fitting section of the card member. Therefore, according to the card edge connector of this aspect, there is no unevenness in the fitting section even when the card member is fitted with the opposing connector, and the watertight property can therefore be increased. According to the card edge connector of this aspect, because a burr or parting line is not formed in the fitting section, there is no need to remove burrs as in conventional practice, and a smooth fitting section can be obtained.

According to the card edge connector of the above aspect, because the fitting section of the card member and the sealing member provided to the opposing connector are fitted together, the watertightness of the card edge connector can be increased. Furthermore, according to the card edge connector of this aspect, because the burr or parting line is formed on the fitting section of the card member, a gap is not formed between the sealing member and the burr or parting line when the card member is fitted with the sealing member, and watertightness can be further increased.

According to the card edge connector of the above aspect, when the card member is connected with the opposing connector, because the sealing member is mounted to the fitting section of the card member, the watertightness of the card edge connector can be increased. Furthermore, according to the card edge connector of this aspect, because a burr or parting line is not formed on the fitting section of the card member, a gap is not formed between the sealing member and the burr when the sealing member is mounted, and watertightness can be further increased.

According to the card edge connector of the above aspect, because the card member is connected while being covered by the outer cover body provided to the opposing connector, damage to the card member by contact or the like can be suppressed.

According to the card edge connector of the above aspect, the guiding protuberances formed on the card member are guided by the outer cover body of the opposing connector formed so as to cover the card member, into the guiding grooves formed in the outer cover body of the opposing connector, and connection can be performed reliably. According to the card edge connector of this aspect, due to the guiding protuberances and the guiding grooves being fitted together, if the card edge connector vibrates, the card member vibrates as well, vibration of the card member alone can be suppressed, and loads can be suppressed from acting on the card member and the card edge terminals connected with the opposing connector. Furthermore, according to the card edge connector of this aspect, because the guiding protuberances are formed on the side surfaces of the card member apart from the fitting section, the card member can be fitted with the outer cover body by long guiding protuberances, and the card member is held more steadfast against vibrations.

According to the card edge connector of the above aspect, due to the locking section formed on the card member and the coupling section formed on the outer cover body being coupled, the card member can be suppressed from coming out of the opposing connector.

According to the card edge connector of the above aspect, the card member can be accurately connected to the opposing connector by fitting the slit formed in the card edge section over the rib formed on the opposing connector. The opposing connector can also be reinforced by providing the rib to the portion of the opposing connector where the card edge section is connected.

BRIEF DESCRIPTION OF THE DRAWINGS

FIG. 4A is a front view of the card member of the embodiment, FIG. 4B is a top view, FIG. 4C is a bottom view, FIG. 4D is a side view seen from one side, FIG. 4E is a side view seen from the other side, and FIG. 4F is a rear view;

FIGS. 6A and 6B are perspective views of manufacturing steps of the card member;

FIG. 7A is a cross-sectional view along line VIIA-VIIA in FIG. 6B, and FIG. 7B is a cross-sectional view along line VIIB-VIIB in FIG. 6B;

FIGS. 11A and 11B are cross-sectional views for describing the connection of the card member and the opposing connector;

FIG. 12A is an enlarged schematic view for describing the connected state of the card member and the contact of the embodiment, and FIG. 12B is an enlarged schematic view describing a conventional example and corresponding to FIG. 12A.

DETAILED DESCRIPTION OF THE INVENTION

An embodiment of the present invention is described below with reference to the drawings. The embodiment presented below gives an example of a card member, a card edge connector, and a method for manufacturing a card member for specifying the technical ideals of the present invention, but the present invention is not meant to be specified as such and can be equally adapted to other embodiments included within the scope of the claims.

Embodiment

Figure 1:
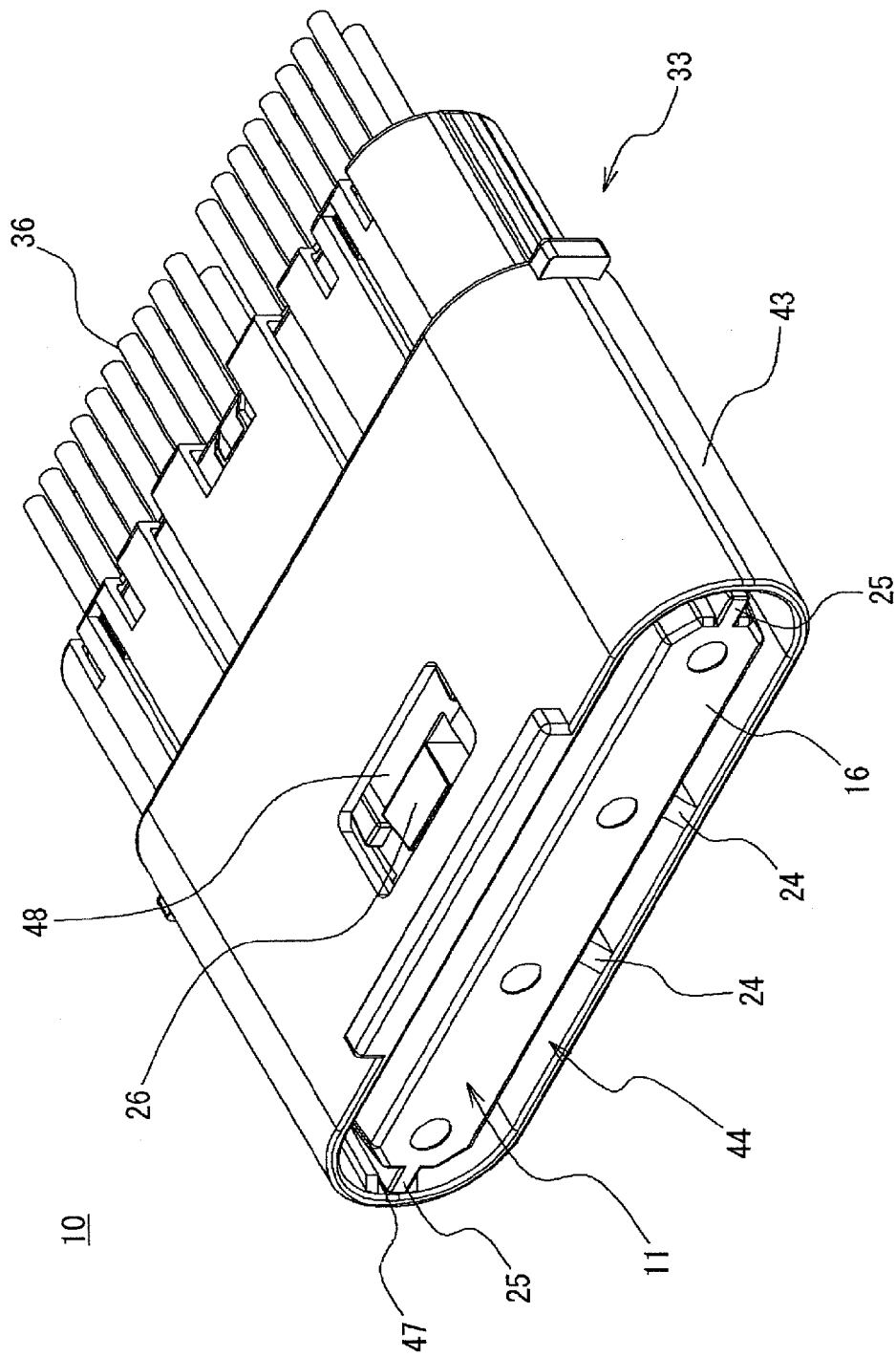
FIG. 1 is a perspective view of the card edge connector of the embodiment.

A card edge connector 10 and its manufacturing method in one exemplary embodiment are described with reference to FIGS. 1 to 12. The card edge connector 10 is configured from a card member 11 and an opposing connector 33 to which the card member 11 is connected, as shown in FIG. 1.

First, the card member 11 of the embodiment shall be described with reference to FIGS. 1 through 5. The card member 11 is configured from: a substrate 12 having a plurality of card edge terminals 14 formed thereon, the card edge terminals being in contact with a contact 34 (see FIG. 11) having circuit wiring or the like printed thereon and provided at one end to the opposing connector 33; and a resin molded section 16 molded integrally from a synthetic resin material so that the card edge section of the substrate 12 protrudes, as shown in FIGS. 2 and 3.

The substrate 12 has a printed circuit and various electronic components or integrated circuits or the like disposed on the front surface or rear surface, and at the end of the substrate is the card edge section 13 on which are formed the plurality of card edge terminals 14, which are brought into contact and electrically connected with the contact 34 of the opposing connector 33, as shown in FIG. 3. The card edge terminals 14 are formed from an electroconductive material which conducts with the circuit wires and the like formed on the substrate 12, and are placed at predetermined intervals. The slit 15 is formed in the card edge section 13, creating a portion which is used for positioning and the like when connected with the opposing connector 33 described hereinafter. This embodiment describes a case in which the card edge section is formed protruding from one end of the resin molded section, but the card edge section is not limited as such and may be formed protruding from both ends of the resin molded section.

The card edge terminals 14 of the card member 11 according to the embodiment are formed on both surfaces, the card edge terminals 14a formed on the top surface and the card edge terminals 14b formed on the bottom surface being formed alternatingly (the card edge terminals 14a formed on the top surface and the card edge terminals 14b formed on the bottom surface are sometimes referred to collectively as the card edge terminals 14 below). The card edge terminals 14 are formed from the same material as the circuit wires or the like, and is formed with a copper wiring pattern plated with tin on the surface, for example. The substrate may be wired on both sides, and a plurality of substrates may be stacked into a multilayered stacked substrate as a single unit.

Figure 2:
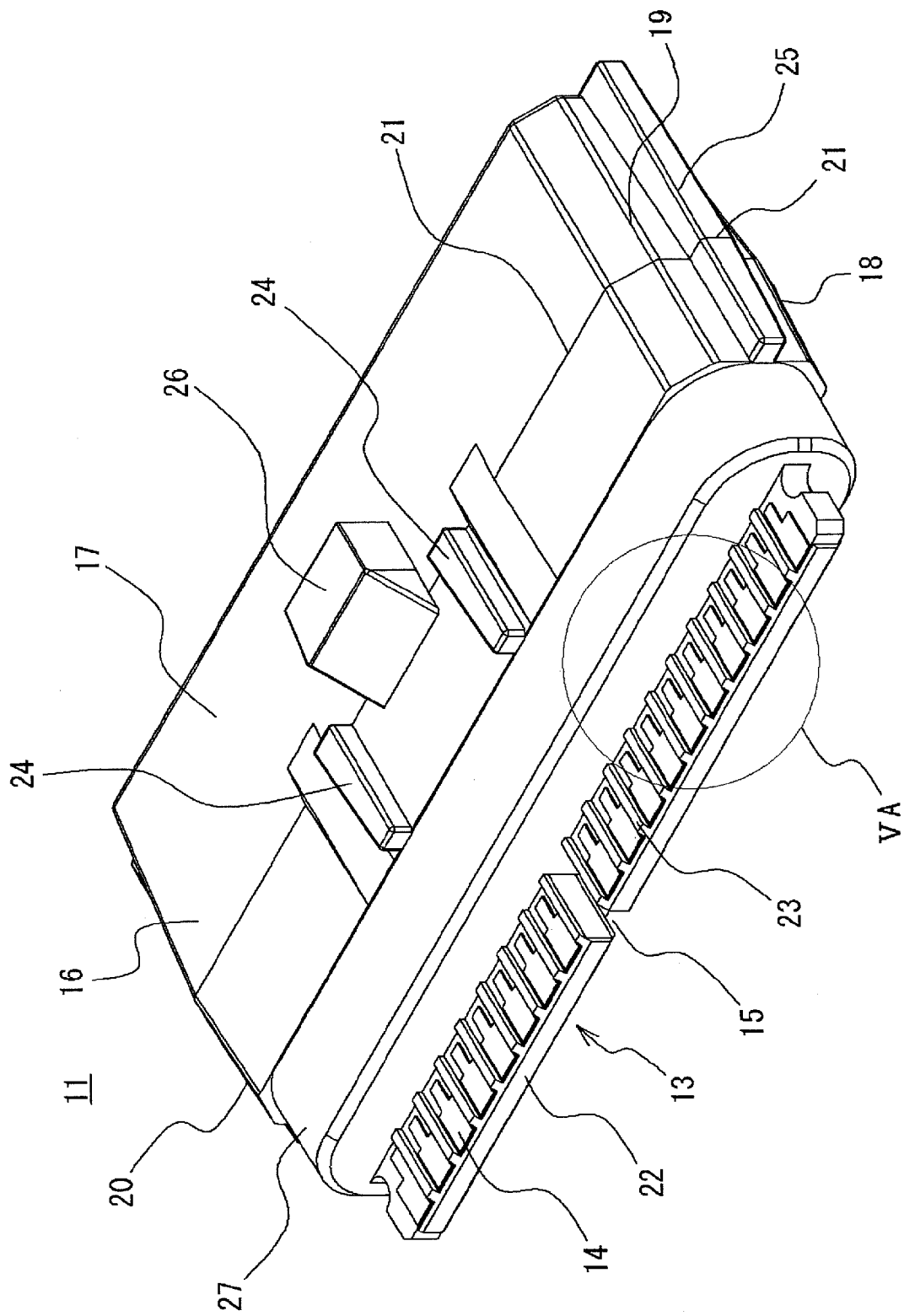
FIG. 2 is a perspective view of the card member of the embodiment.
Figure 3A:
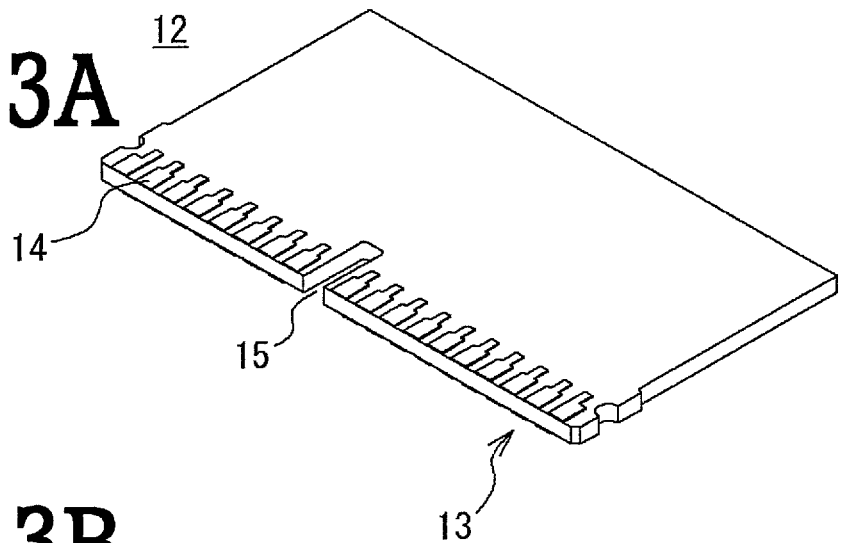
FIG. 3A is a perspective view of the substrate of the embodiment.
Figure 3B:
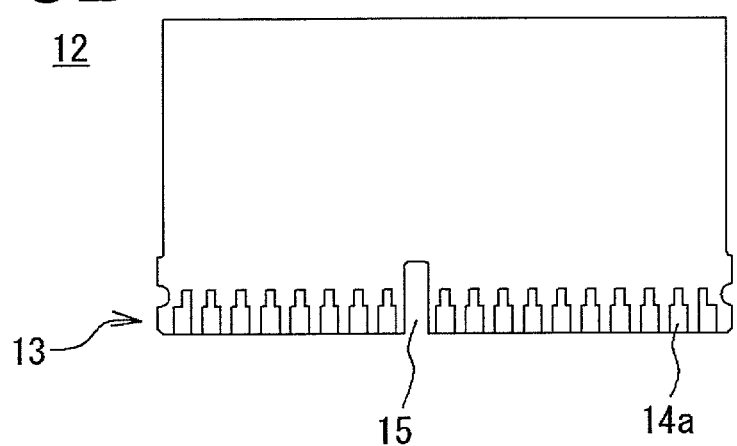
FIG. 3B is a top view.
Figure 3C:
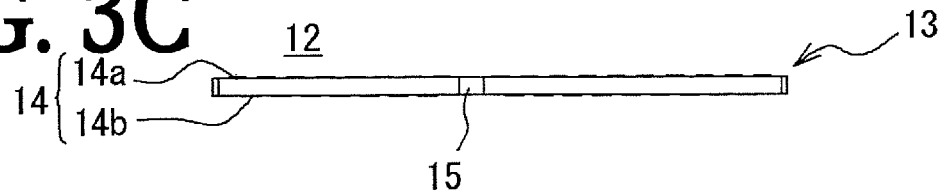
FIG. 3C is a front view.
Figure 3D:
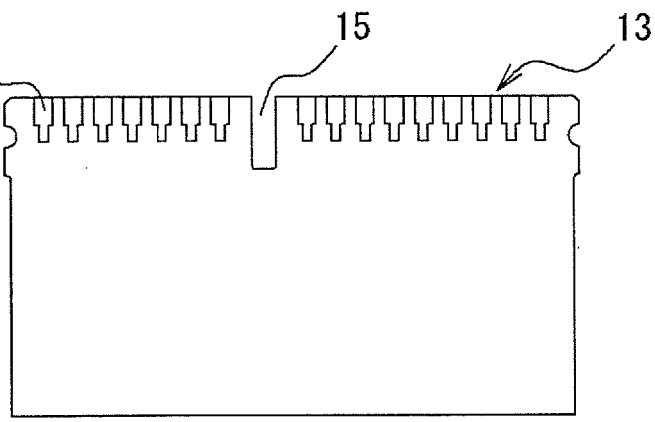
FIG. 3D is a bottom view.

The resin molded section 16 is formed from a low-profile cuboid formed so that the substrate 12 is contained within, as shown in FIGS. 2 and 4. Engaging protuberances 24 used to guide and position when the resin molded section 16 is connected with the opposing connector 33 are formed on the top surface 17 and the bottom surface 18 thereof, guiding protuberances 25 are formed in the side surfaces 19, 20 of the resin molded section 16, and a locking section 26 which engages with the opposing connector 33 is formed substantially in the center of the top surface 17 of the resin molded section 16.

An annular fitting section 27 is formed in the resin molded section 16, in the portion that connects with the opposing connector 33 on the side where the card edge section 13 protrudes. At this time, the engaging protuberances 24, the locking section 26, and the guiding protuberances 25 are formed on the resin molded section 16 in different portions from where the fitting section 27 is formed. The symbol 21 shown in the central outer periphery of the resin molded section 16 indicates a burr formed during the molding of the resin molded section 16, the details of which are described hereinafter. The burr is a lump of resin jutting out from the joined portion of the mold being used (also referred to as the parting line), formed when the synthetic resin material is molded by injection molding such as mold-forming.

A protective section 22 is formed in the end of the card edge section 13 protruding from one end of the resin molded section 16, and dividing wall sections 23 are formed between the card edge terminals 14 of the card edge section 13. The protective section 22 and the dividing wall sections 23 are formed integrally with the resin molded section 16 from a synthetic resin material.

Figure 5A:
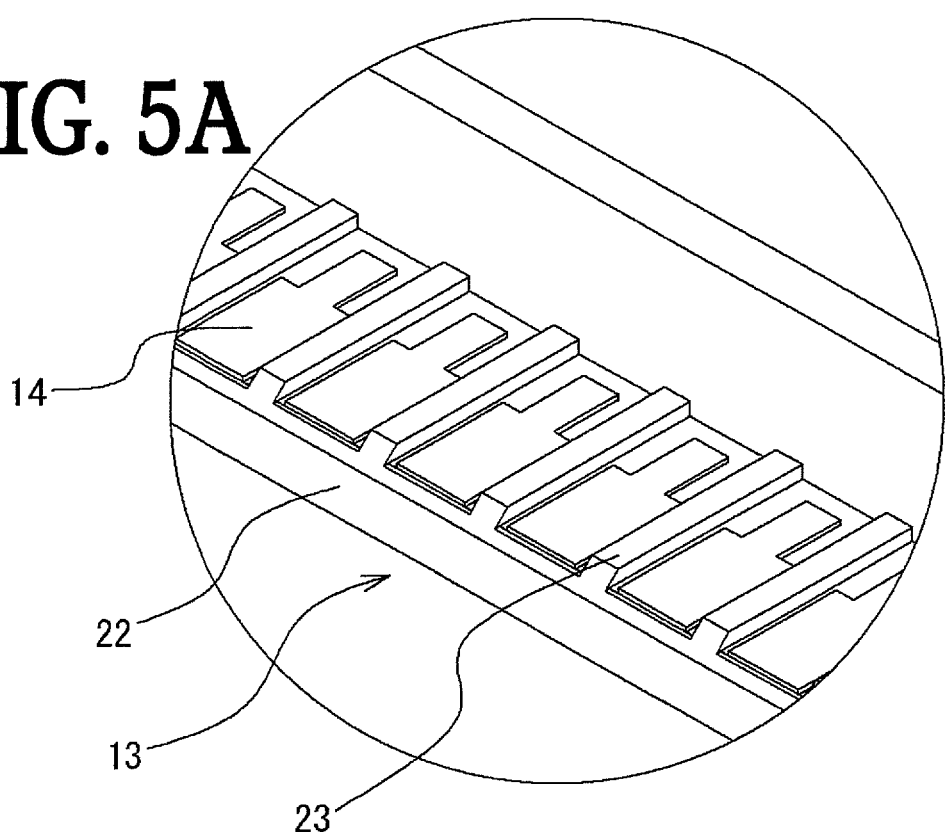
FIG. 5A is an enlarged view of section VA of FIG. 2.
Figure 5B:
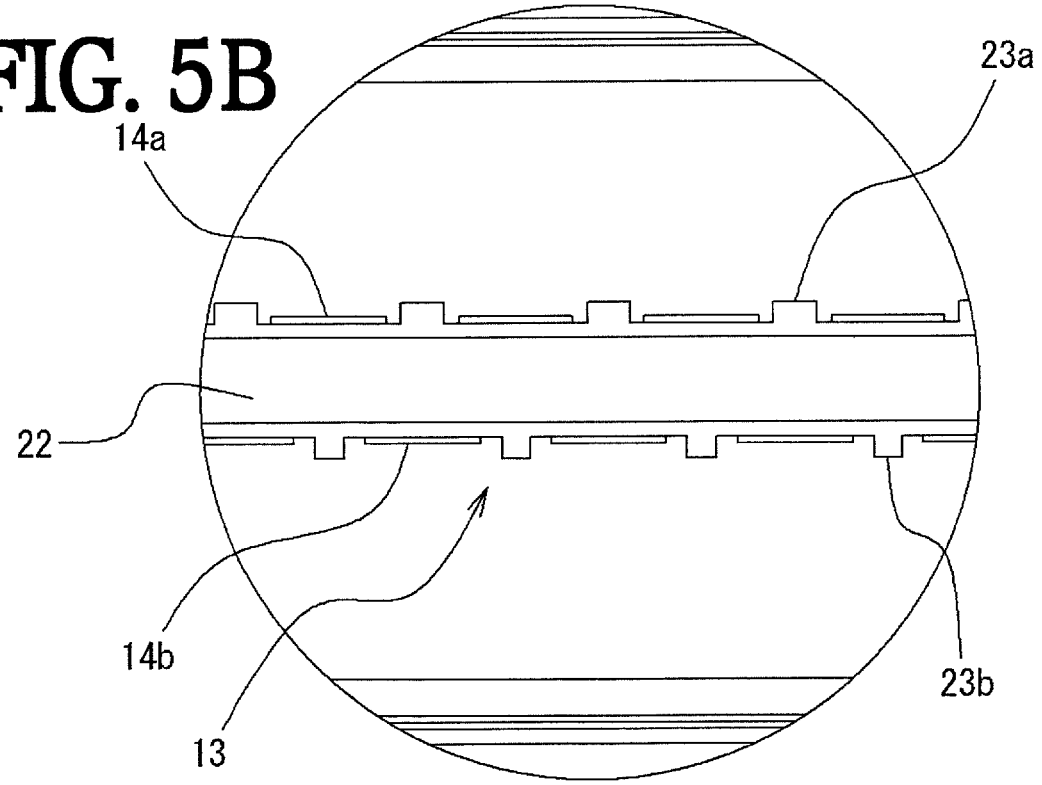
FIG. 5B is an enlarged view of section VB of FIG. 4A.

The protective section 22 is formed so that the end surface of the protruding card edge section 13, i.e., the side inserted into the opposing connector 33 is covered as shown in FIG. 5. The end surface of the card edge section 13 being covered means that the protective section 22 is formed and covered with the same thickness as the plate thickness of the substrate 12. The protective section 22 is formed with the thickness in a direction horizontal with the substrate surface, and the outer side of this horizontal thickness may be curved at the corners or may be gradually thinned into a tapered shape. Doing so results in the card edge section 13 of the substrate 12 being covered by the protective section 22, making it possible to soften the impact of the card member 11 falling, and also making it possible to suppress scratching of the substrate 12 from contact with the contact 34 of the opposing connector 33 when the card edge terminals 14 and the opposing connector 33 are connected.

The dividing wall sections 23 are formed on the card edge section 13 of the substrate 12, and are formed from a synthetic resin material integrally with the resin molded section 16 and the protective section 22 so has to have predetermined thicknesses between the card edge terminals 14. Due to the formation of the dividing wall sections 23, the card edge terminals 14 are subdivided on the card edge section by the dividing wall sections 23 and the resin molded section 16. Therefore, when liquid adheres to the card edge section 13, because the card edge terminals 14 are subdivided, the liquid adhering to one card edge terminal 14 can be suppressed from moving to card edge terminal 14 in the adjacent subdivisions, and short circuits amount card edge terminals 14 caused by the liquid can be suppressed. The strength of the card edge section 13 can be increased, and impact from falling and scratches during connection can be better suppressed.

Furthermore, the dividing wall sections 23 are formed on the top and bottom sides of the card edge section 13, and are provided so that the dividing wall sections 23a formed on the top side and the dividing wall sections 23b formed on the bottom side alternate (the top and bottom dividing wall sections 23a, 23b are sometimes referred to below simply as the dividing wall sections 23). Specifically, the dividing wall sections 23b on the bottom side are formed so as to alternate between adjacent dividing wall sections 23a on the top side. The card edge terminals 14 formed on the substrate 12 as described above are also formed so as to alternate on the top and bottom sides of the substrate 12, and the dividing wall sections 23 are therefore formed on the opposing sides of the card edge terminals 14. Because the dividing wall sections 23 are formed integrally with the resin molded section 16 by mold-forming, the dividing wall sections are firmly bonded to the substrate 12 and no gaps are formed between the dividing wall sections 23 and the substrate 12. By doing so, whiskers, which have been a problem when forming the surfaces of the card edge terminals 14 with tin plating, can be suppressed from contacting other card edge terminals 14 due to the formation of the dividing wall sections 23, and short circuiting of the substrate 12 can be suppressed.

The fitting section 27 is formed on the outer periphery of the resin molded section 16 on the side where the card edge section 13 protrudes as shown in FIGS. 2 and 4, and when the card member 11 is connected to the opposing connector, the fitting section is fitted with a sealing member provided to the opposing connector. The details of the fitting section 27 are described hereinafter.

Next, the method for manufacturing the card member 11 is described with reference to FIGS. 6 and 7. As described above, the card member 11 is formed by mold-forming the substrate 12 from a synthetic resin material. First, a first mold 28 and a second mold 29 (sometimes referred to collectively simply as the mold 30 below) are prepared, which are allotted to an upper space Sa and a lower space Sb forming a space S which is cut to conform to the shape of the card member 11 being formed, as shown in FIG. 6A. At this time, the space Sa of the first mold 28 and the space Sb of the second mold 29 are formed so that the card edge section 13 of the substrate 12 is disposed in a vertical orientation facing upward. Furthermore, the mold 30 is disposed so that the joining portion 31 of the first mold 28 and the second mold 29 is not disposed in a position 32 corresponding to the fitting section 27 of the resin molded section 16 when the card member 11 is formed, i.e., so that the joining portion 31 of the first mold 28 and the second mold 29 does not correspond or overlapped to the fitting section 27 formed in the card member 11. In cases in which a card edge section is formed at both ends of the substrate, the card edge sections at both ends are disposed in the vertical direction.

Figure 14A:
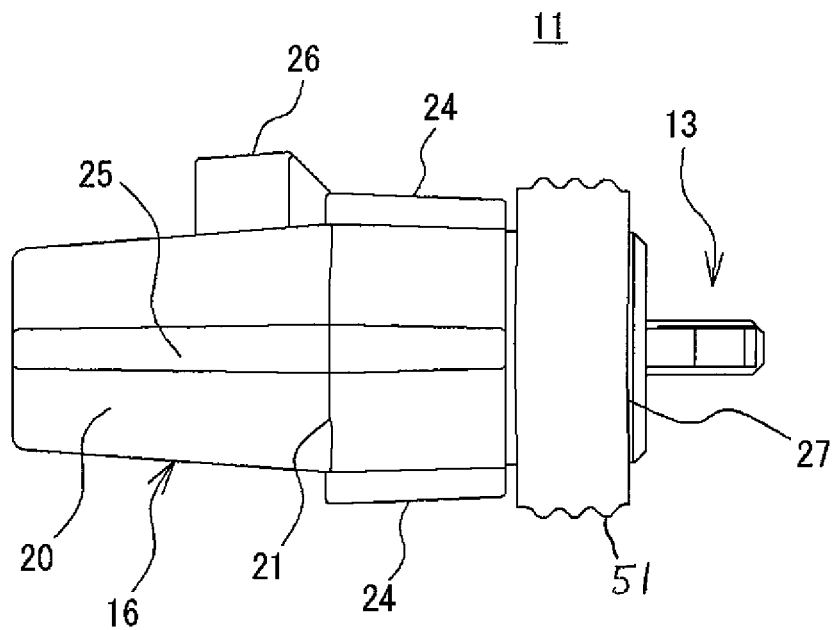
FIG. 14A is a side view of the card member.
Figure 14B:
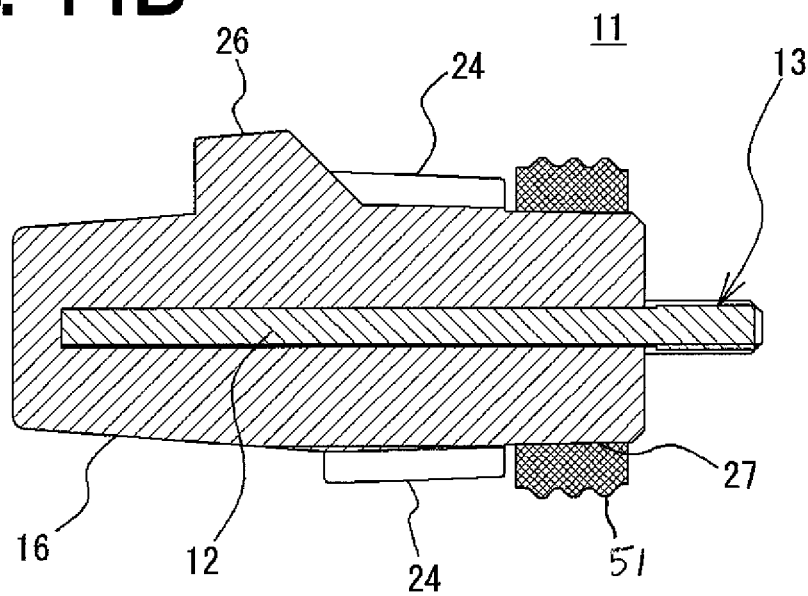
FIG. 14B is a cross-sectional view of the card member.

In addition, according to an alternative embodiment, as shown in FIGS. 14A and 14B, a sealing member 51 may be mounted to the fitting section 27 of card member 11. In this alternative embodiment, the sealing member 51 may be sized to fit within outer cover body 43 when the card member 11 is engaged with opposing connector 33.

Next, the substrate 12 is disposed inside the mold 30. This involves first disposing the substrate 12 with a vertical orientation so that the card edge section 13 faces upward inside the space Sb of the second mold 29 placed on the bottom side, and then attaching the first mold 28 on top of the second mold 29 so that the substrate 12 is inserted into the space Sa of the first mold 28 (see FIG. 6B).

At this time, the joining portion 31 of the first mold 28 and the second mold 29 is designed to not be disposed in the joining portion 31 corresponding or overlapping to the fitting section 27 of the card member 11 being formed, as shown in FIGS. 7A and 7B. In the embodiment, because the engaging protuberances 24, the locking section 26, and the guiding protuberances 25 are formed in the resin molded section, the joining portion 31 of the first mold 28 and the second mold 29 is disposed in the portion easily removed from the mold 30 after molding.

Next, the synthetic resin material is injected into the space S of the mold 30 and the resin molded section 16 is molded on the substrate 12. A conventionally known method can be used for this mold-forming, but transfer molding is preferred. The resulting article is then cooled, the mold is removed, the card member 11 is taken out, and manufacture of the card member 11 shown in FIG. 2 is complete.

By doing so, the joining portion 31 of the mold 30 is not disposed in the fitting section 27 of the manufactured card member 11, the burr or parting line 21 formed on the joining portion 31 of the mold 30 is therefore not formed on the fitting section 27, and a fitting section 27 with a smooth surface can be formed.

Figure 8A:
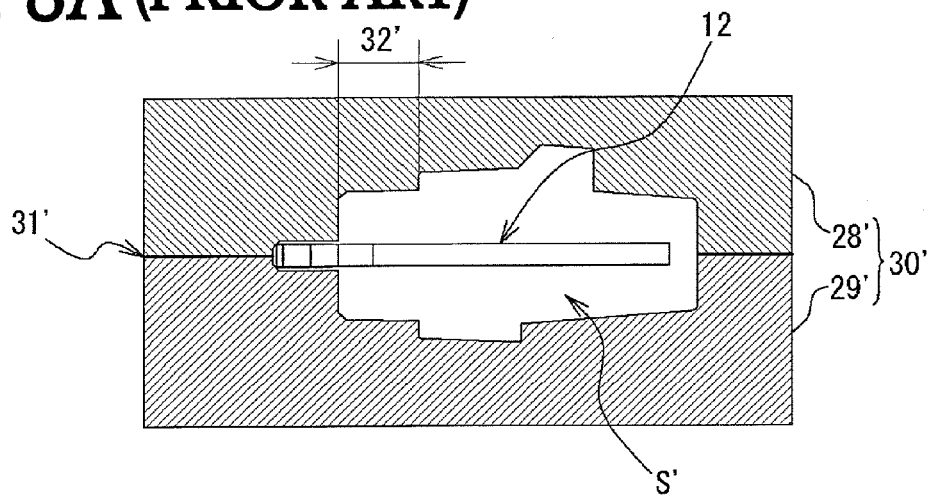
FIGS. 8A to 8C are drawings showing a conventional example for comparison with the embodiment, FIG. 8A being a cross-sectional view corresponding to FIG. 7A, FIG. 8B being a side view corresponding to FIG. 4E, and FIG. 8C being an enlarged perspective view of section VIIIC in FIG. 8B.
Figure 8B:
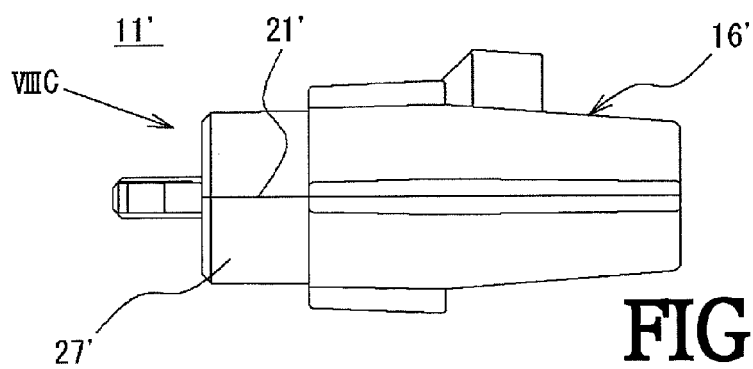
Figure 8C:
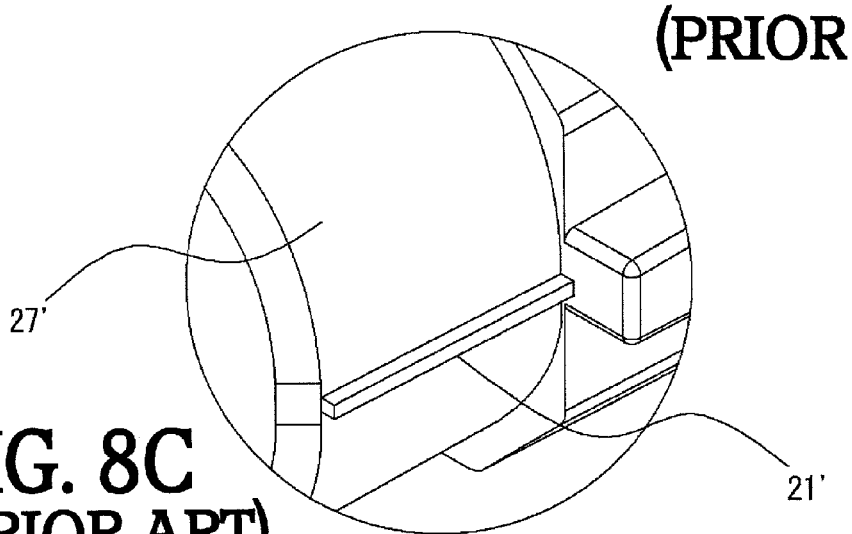

In contrast, when the substrate 12 is disposed horizontally in the mold 30' as shown in FIG. 8A of a conventional manufacturing method, the joining portion 31' of the mold 30' is positioned in a direction horizontal with the substrate 12 of the resin molded section 16' formed on the card member 11', and a burr 21' is formed in a direction horizontal with the card member 11' manufactured in this position (see FIGS. 8B and 8C). As a result, when the horizontal burr 21' is formed on the side surface of the fitting section 27' of the card member 11' as shown in FIG. 8, there is a risk that when the card member is fitted with a sealing member 41 of the opposing connector 33, a gap will be formed in the fitting section 27' between the burr 21' and the sealing member 41 and liquid will infiltrate through this gap.

In the card member 11 of the embodiment, as shown in FIGS. 4B through 4E, because the burr 21 is formed approximately in the middle of the outer periphery of the resin molded section 16 and a burr is not formed on the fitting section 27 of the card member 11, a gap is not formed even when the card member is fitted with the sealing member 41 of the opposing connector 33, and high watertightness can therefore be achieved. Furthermore, because a step for removing the burr is no longer needed, scanning or the like can be performed and the card member can be shipped out immediately after manufacture, and productivity can therefore also be made more efficient. The mold-forming for forming the resin molded section can be performed by conventional methods, a typical example of which is transfer molding.

If the joining portion of the mold is not disposed so as to correspond to the fitting section 27 of the card member 11, the position of the joining portion of the mold can be varied by the shape of the card member being formed. Furthermore, in the above description, the substrate disposed in the mold is designed so that the card edge section is on the top side, but is not limited as such and may be disposed so that the card edge section is on the bottom side. The molds are also not limited to be disposed vertically, and may be disposed and slid in a horizontal direction.

Figure 9:
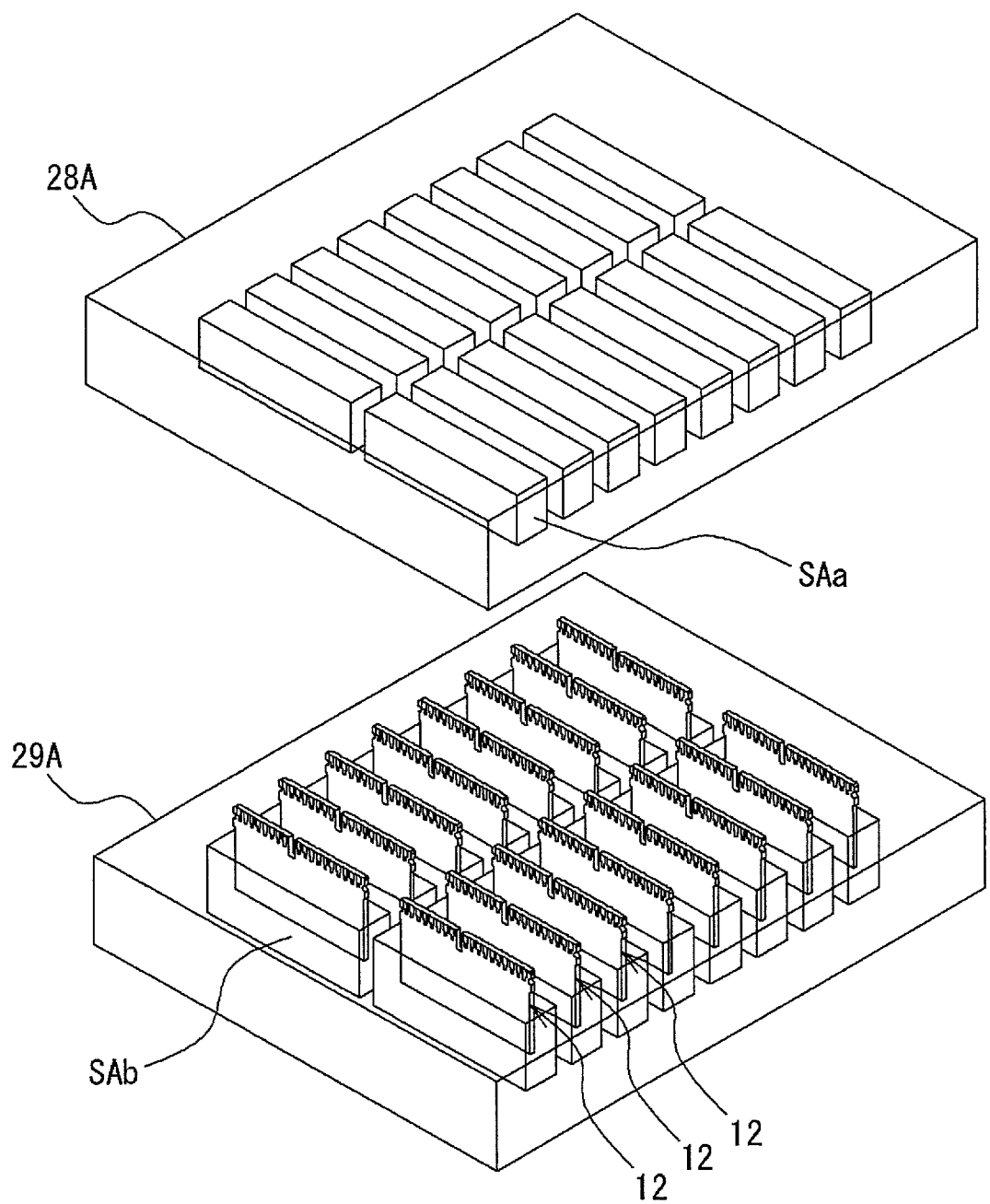
FIG. 9 is a perspective view showing another example of a method for manufacturing the card member of the embodiment.
Figure 10:
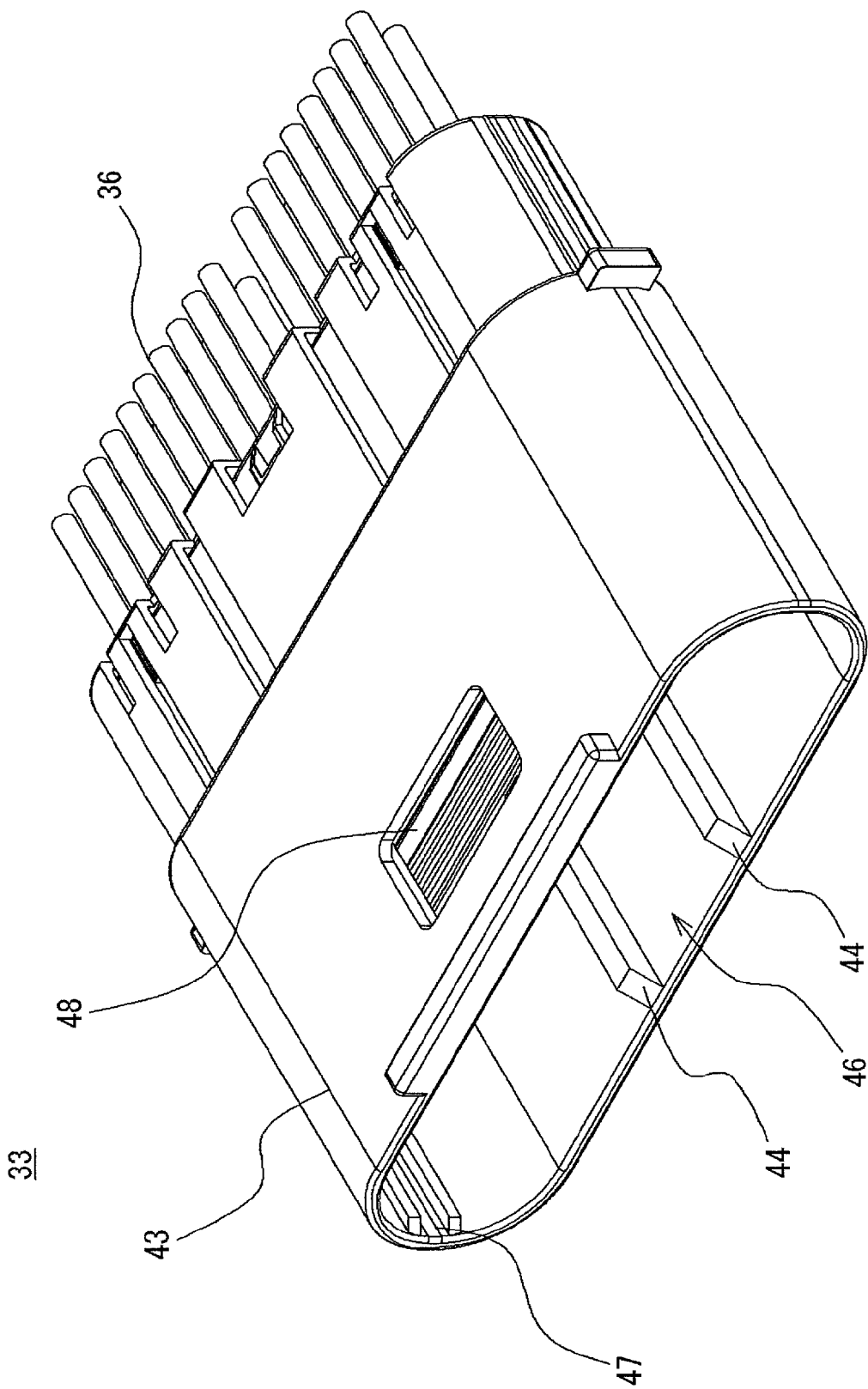
FIG. 10 is a perspective view of the opposing connector of the embodiment.
Figure 13:
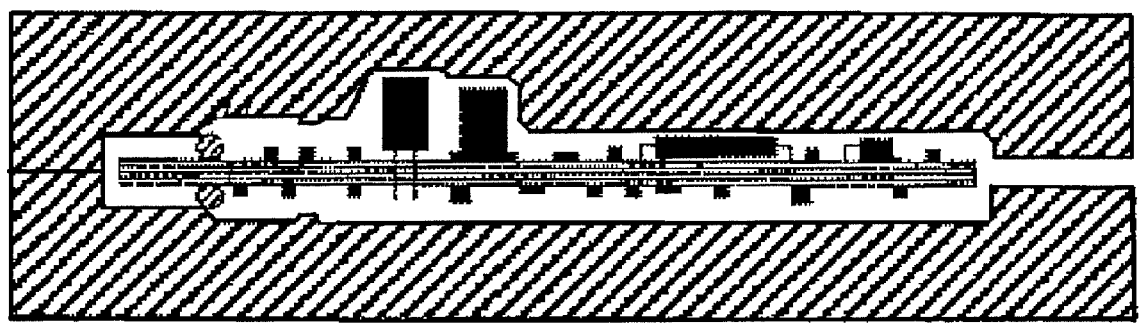
FIG. 13 is a cross-sectional view showing the prior art.

FIGS. 6 and 7 show a case in which one card member is manufactured using a first mold and a second mold as a pair, but another option as shown in FIG. 9 is to make a plurality of cuts in a first mold 28A and a second mold 29A as a pair, form spaces SAa and SAb in the molds, dispose a plurality of substrates in these spaces SA, and manufacture a plurality of card members in a single molding. Because molds are formed so that the substrates are disposed in a horizontal direction in conventional practice, the substrates occupy more surface area relative to the surface area of the molds, and it has therefore only been possible to form spaces in a small number of cuts. However, by disposing the substrates in a vertical direction as in the embodiment, the surface area occupied by the substrates is smaller relative to the surface area of the molds, and more spaces in cuts can be formed. Therefore, the number of card members formed with a single molding can be increased, and card members can therefore be manufactured more efficiently.

Next, the connecting of the card member 11 to the opposing connector 33 shall be described. First, the opposing connector 33 of the embodiment is described with reference to FIGS. 1, 10, and 11A. The opposing connector 33 is configured from a plurality of wires 36 connected to an external device, a plurality of contacts 34 connected with the wires 36, a housing 37 in which contact accommodating sections 40 are formed for supporting and fixing the contacts 34 in place inside the housing 37, an annular sealing member 41 provided to the outer periphery of the housing 37, a wire seal 42 which is provided inside the housing 37 and which fixes the wires 36 in place inside the housing 37 and suppresses the infiltration of liquid from the wires 36 side, and an outer cover body 43 for covering the housing 37 and the sealing member 41.

The housing 37 is formed into a tubular shape having at one end a flat open section 38 widening in the width direction, where the card edge section 13 of the card member 11 is inserted and connected, and having at the other end insertion holes 39 through which the wires 36 are inserted. On the top and bottom sides which are symmetrical about the flat open section 38 of the housing 37, the contact accommodating sections 40 are formed wherein the contacts 34 are accommodated. The contact accommodating sections 40 are formed alternatingly so as to correspond to the card edge terminals 14 being connected. A rib (not shown) for joining together the top and bottom sides above and below the flat open section 38 is also formed in the housing 37. The rib is a portion fitted into a slit 15 formed in the card edge section 13 of the card member 11. The wire seal 42 is provided to the insertion holes 39 side of the housing 37.

The contacts 34 are electrically connected with the card edge section 13 of the card member 11, and are formed from an electroconductive material, one group of ends having connecting sections 35 connected with the card edge terminals 14, and the other group of ends having connecting sections 35 connected with the wires 36. The contacts 34 are disposed corresponding to the card edge terminals 14 so as to alternate on the top and bottom sides symmetrically about the flat open section 38 of the housing 37, and are accommodated in the contact accommodating sections 40 of the housing 37.

The sealing member 41 is provided to the outer periphery on the flat open section 38 side of the housing 37, and is formed into a large tubular shape which protrudes out from the end of the housing 37, the card member 11 being fitted with this protruding portion. Concavities and convexities are formed in annular shapes on the inner side of the sealing member 41.

The outer cover body 43 is formed into a large tubular shape covering the housing 37, the sealing member 41, and the card member 11 connected to the housing 37, and is formed from a synthetic resin material, one end having an insertion hole 44 into which the card member 11 is inserted, and the other end having an insertion hole 45 into which the wires 36 are inserted. The top section of the outer cover body 43 is provided with an engaging hole 48 which engages with the locking section 26 formed on the card member 11. Furthermore, on the inner side of the outer cover body 43, engaging grooves 46 and guiding grooves 47 are formed corresponding with the engaging protuberances 24 and the guiding protuberances 25 formed on the outer side of the card member 11.

Connecting the opposing connector 33 and the card member 11 involves first inserting the card member 11 through the insertion hole 44 of the outer cover body 43 with the card edge section 13 of the card member 11 heading in first. At this time, the card member is inserted with the positions of the engaging grooves 46 and guiding grooves 47 of the outer cover body 43 aligned with the positions of the engaging protuberances 24 and guiding protuberances 25 of the card member 11. At this time, the slit 15 formed in the card edge section 13 of the card member 11 is fitted with the rib formed in the flat open section 38 of the housing 37. Continuing the insertion, the card edge terminals 14 are connected with the connecting sections 35 of the contacts 34, the engaging hole 48 of the outer cover body 43 and the locking section 26 of the card member 11 are engaged together, and the sealing member 41 of the opposing connector 33 is engaged with the fitting section 27 of the card member 11, thereby completing the connection. The dividing wall sections 23 of the card member 11 also function as guides for making accurate contact with the card edge terminals 14 when the contacts 34 of the opposing connector 33 are mounted.

With the card edge connector 10 assembled in this manner, because no burrs or parting line are formed on the fitting section 27 formed on the card member 11, the front surface is formed smoothly, and the formation of a gap is suppressed when the card member is fitted with the sealing member 41. Therefore, a high level of watertightness can be achieved.

Because the card member 11 is covered by the outer cover body 43 provided to the opposing connector 33, damage to the card member 11 by contact or the like can be suppressed. Furthermore, the guiding protuberances 25 formed on the card member 11 are guided by the outer cover body 43 of the opposing connector 33, formed so as to cover the card member 11, to the guiding grooves 47 formed in the outer cover body 43 of the opposing connector 33, and connection can be performed reliably.

By forming the guiding protuberances on portions of the side surfaces of the card member other than the fitting section and engaging the guiding protuberances together with the guiding grooves of the outer cover body of the opposing connector, if the card edge connector vibrates, the card member vibrates as well, vibration of the card member alone can be suppressed, and loads can be suppressed from acting on the card member and the card edge terminals connected with the opposing connector.

FIG. 12 is referenced to describe the contact between the contacts of the opposing connector 33 and the card edge terminals 14 of the card member 11. The contacts are not illustrated in FIG. 12, but are instead expressed as pressure force P. In a state in which the contacts are in contact with the card edge terminals 14, the dividing wall sections 23 are provided to the sides opposite of each contact, as shown in FIG. 12. Doing so causes a risk that the pressure forces P of the contacting contacts will act on the card edge terminals 14 and the substrate portions or terminal portions of the card edge terminals 14 will be deformed by these pressure forces P. At this time, in a conventional example in which the card edge terminals 14 of the top and bottom sides are formed in parallel as shown in FIG. 12B, each portion would be subject to pressure forces P from both sides, and the amount of deformation D would be greater.

However, because the card edge terminals 14 of the embodiment are provided so that the top side 14a and bottom side 14b alternate as shown in FIG. 12A, the dividing wall sections 23 are formed between each of the card edge terminals 14, whereby the pressure forces P acting on the card edge terminals 14 are supported by the dividing wall sections 23a, 23b formed on the opposite sides, the amount of deformation D in these portions can be reduced, and poor contact caused by deformation of the card edge terminals 14 can therefore be suppressed.

The invention claimed is:

1. A card member, comprising:
a substrate having a card edge section in which at least one card edge terminal to be connected to an opposing connector is formed on at least one surface of the card edge section; and
a resin molded section having a fitting section to be fitted with the opposing connector formed of synthetic resin material integrally formed with the substrate in which the substrate is protruded from at least one end of the fitting section; wherein
the resin molded section is formed with a parting line at a place other than the fitting line by placing the substrate in a first mold and a second mold during a mold-forming process in such a way that a joining portion of the first mold and the second mold is not overlapped with the fitting portion.

2. The card member according to claim 1, wherein the parting line is disposed in a direction perpendicular to the direction in which the card edge section protrudes.

3. The card member according to claim 1, wherein the fitting section is formed into annular shape around the card edge section.

4. The card member according to claim 1, wherein the end surface of the card edge section is provided with a protective section formed integrally with the resin molded section.

5. The card member according to claim 1, wherein in the card edge section, dividing wall sections erected between the card edge terminals are formed integrally with the resin molded section.

6. The card member according to claim 5, wherein the dividing wall sections are formed alternatingly on both surfaces of the substrate.

7. The card member according to claim 1, wherein the surfaces of the card edge terminals are formed by tin plating.

8. A card edge connector, comprising:
a card member; and
an opposing connector, the opposing connector being connected to the card member,
wherein the card member comprises:
a substrate having a card edge section in which at least one card edge terminal to be connected to an opposing connector is formed on at least one surface of the card edge section; and
a resin molded section having a fitting section to be fitted with the opposing connector formed of synthetic resin material integrally formed with the substrate in which the substrate is protruded from at least one end of the fitting section; wherein
the substrate is insert molded into the resin molded section, and
the resin molded section is formed with a parting line at a place other than the fitting line by placing the substrate in a first mold and a second mold during a mold-forming process in such a way that a joining portion of the first mold and the second mold is not overlapped with the fitting portion.

9. The card edge connector according to claim 8, wherein an annular sealing member is provided to the portion of the opposing connector that is fitted with the fitting section of the card member.

10. The card edge connector according to claim 8, wherein an annular sealing member is mounted to the fitting section of the card member.

11. The card edge connector according to claim 8, wherein the opposing connector has an outer cover body for covering the card member when the card member is connected.

12. The card edge connector according to claim 10, wherein guiding protuberances formed protruding integrally with the resin molded section are provided to a pair of opposing side surfaces of the resin molded section of the card member apart from the fitting section;
guiding grooves for guiding the guiding protuberances are formed in an outer cover body; and the guiding protuberances and the guiding grooves are fitted together.

13. The card edge connector according to claim 11, wherein at least one surface of the resin molded section of the card member apart from the fitting section has a locking section formed protruding integrally with the resin molded section;

a coupling section which couples with the locking section is formed on the outer cover body of the opposing connector; and the locking section and the coupling section are coupled together.

14. The card edge connector according to claim 11, wherein at least one slit is formed in the card edge section of the card member; and a rib is formed in a position corresponding to the slit in the portion of the opposing connector where the card edge section is connected.

* * * * *